US007095259B2

(12) United States Patent
Knotts

(10) Patent No.: US 7,095,259 B2
(45) Date of Patent: Aug. 22, 2006

(54) REDUCING METASTABLE-INDUCED ERRORS FROM A FREQUENCY DETECTOR THAT IS USED IN A PHASE-LOCKED LOOP

(75) Inventor: Thomas A. Knotts, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 23 days.

(21) Appl. No.: 10/967,824

(22) Filed: Oct. 18, 2004

(65) Prior Publication Data

US 2006/0082402 A1  Apr. 20, 2006

(51) Int. Cl.
*H03L 7/00* (2006.01)
(52) U.S. Cl. .................. 327/156; 375/375; 331/25
(58) Field of Classification Search ............... None
See application file for complete search history.

(56) References Cited

U.S. PATENT DOCUMENTS

| | | | | |
|---|---|---|---|---|
| 6,055,286 A * | 4/2000 | Wu et al. | ............. | 375/375 |
| 6,310,521 B1 * | 10/2001 | Dalmia | ............. | 331/11 |
| 6,392,495 B1 * | 5/2002 | Larsson | ............. | 331/11 |
| 6,545,545 B1 | 4/2003 | Fernandez-Texon | ............. | 331/1 R |
| 6,937,069 B1 * | 8/2005 | Galloway et al. | ............. | 327/39 |

OTHER PUBLICATIONS

Dunning, Garcia, Lundberg, Nuckolls, An all-Digital Phase-Locked Loop with 50-Cycle Lock Time Suitable for High-Performance Microprocessors, IEEE Journal of Solid-State Circuits, vol. 30, No. 4, Apr. 1995, pp. 412-422.
Anand, Razavi, A 2.75 Gb/s CMOS Clock Recovery Circuit with Broad Capture Range, IEEE ISSCC 2001 Degest, P. 214.
Noguchi, Tateyama, Okamoto, Uchida, Kimura, and Takahashi, A 9.9G-10.8Gb/s Rate-Adaptive Clock and Data-Recovery with No External Reference Clock for WDM Optical Fiber Transmission, IEEE ISSCC 2002 Digest, p. 252.
B. Wu, R. Walker, "PLL Design in HP's Gigabit Ethernet Transceiver," 1997 HP Design Technology Conference Proceedings, pp. 367-375.

* cited by examiner

*Primary Examiner*—Tuan T. Lam

(57) ABSTRACT

A technique for reducing the likelihood that a frequency detector will incorrectly assert control over a VCO because of metastable-induced errors involves qualifying frequency detector control signals by requiring multiple consecutive control signals that indicate the frequency detector should assert control over the VCO before the frequency detector is allowed to assert control over the VCO. In an embodiment, the frequency detector control signals are qualified by a series of full-swing library cell flip-flops.

20 Claims, 7 Drawing Sheets

FIG.6

| Sampling Interval | Qualification Logic ||||||  |
|---|---|---|---|---|---|---|---|
| | Flip-Flop Output ||||| q_fd_en | Frequency Detector asserts control over VCO (Y/N) |
| | 0 | 1 | 2 | 3 | 4 | | |
| 1 | 0 | 0 | 0 | 0 | 0 | 0 | N |
| 2 | 1 | 0 | 0 | 0 | 0 | 0 | N |
| 3 | 0 | 1 | 0 | 0 | 0 | 0 | N |
| 4 | 0 | 0 | 1 | 0 | 0 | 0 | N |
| 5 | 0 | 0 | 0 | 1 | 0 | 0 | N |
| 6 | 1 | 0 | 0 | 0 | 1 | 0 | N |
| 7 | 1 | 1 | 0 | 0 | 0 | 0 | N |
| 8 | 1 | 1 | 1 | 0 | 0 | 0 | N |
| 9 | 1 | 1 | 1 | 1 | 0 | 0 | N |
| 10 | 1 | 1 | 1 | 1 | 1 | 0 | N |
| 11 | 1 | 1 | 1 | 1 | 1 | 1 | Y |

REDUCING METASTABLE-INDUCED ERRORS FROM A FREQUENCY DETECTOR THAT IS USED IN A PHASE-LOCKED LOOP

CROSS-REFERENCE TO RELATED APPLICATION

This application is related to U.S. patent application Ser. No. 10/714,037, filed Nov. 11, 2003 and entitled PROGRAMMABLE FREQUENCY DETECTOR FOR USE WITH A PHASE-LOCKED LOOP.

BACKGROUND OF THE INVENTION

Phase-locked loops (PLLs) are used in data communications and telecommunications applications to lock onto the frequency of a signal. In particular, PLLs are often used in serializer/deserializer (SerDes) applications. A typical PLL includes a phase detector, a charge pump, a loop filter, and a voltage controlled oscillator (VCO) that produces a VCO signal. A central component in ensuring signal lock is the phase detector. There are generally two classes of phase detectors, analog and digital. With a digital phase detector, if the frequency difference between the input and VCO signals is too large (typically greater than 1%), it is difficult for the PLL to achieve lock. Separate frequency detectors have been added to PLLs with digital phase detectors to ensure that the PLLs are able to achieve lock when the frequencies of the input and VCO signals are far apart (i.e., outside the capture range of the digital phase detector). The frequency detector of a PLL provides a frequency measurement of the VCO signal that is used to determine whether or not the frequency detector should assert control over the VCO signal. If the frequency detector is to assert control over the VCO signal, then the frequency detector is used to pull the frequency of the VCO signal close to a pre-established target frequency. Once the frequency of the VCO signal is within the capture range of the phase detector, control of the VCO is switched over to the phase detector.

One type of frequency detector, which is disclosed in U.S. patent application Ser. No. 10/714,037, filed Nov. 14, 2003, and entitled PROGRAMMABLE FREQUENCY DETECTOR FOR USE WITH A PHASE-LOCKED LOOP, utilizes a counter that counts the transitions of the VCO signal over a known sampling period to measure the frequency of the VCO signal. The timing of the transition sampling is tied to an external reference clock that is not synchronized with the VCO signal. Because the reference clock signal and the VCO signal are not synchronized, it is possible that the rising edges of the VCO signal and the signal that enables the counter could coincide with each other and cause the counter to be driven into a temporary metastable state. The metastable state of the counter can cause the counter to have an inaccurate value at the end of the respective sampling period. If the metastable state causes the counter value to be higher or lower than it should have been at the end of the sampling period, then the inaccurate counter value could cause the frequency detector to assert control over the VCO signal even though the frequency of the VCO is within the established deadband region. Although metastable-induced errors would likely be rare, they are unacceptable in some applications.

One technique for controlling metastable-induced errors involves passing the counter enable signal through a series of flip-flops, which are driven by the VCO, before the enable signal is applied to the counter. Passing the counter enable signal through a series of flip-flops gives time for a metastable state to resolve itself before reaching the counter and ensures that the rising edges of the VCO and retimed enable signals do not coincide. A drawback to passing the counter enable signal through a series of flip-flops is that the performance requirements of the flip-flops dictate the use of high power flip-flops, such as common mode logic (CML) flip-flops. In addition to consuming relatively large amounts of power, high power flip-flops typically require a large area on an integrated circuit (IC) chip compared to full-swing library cell flip-flops. Additionally, buffer amplifiers are required because all of the flip-flops must be driven by the same VCO signal.

In view of the above, what is needed is a technique for operating a PLL that reduces the likelihood that the frequency detector will incorrectly assert control over the VCO because of metastable-induced errors.

SUMMARY OF THE INVENTION

A technique for reducing the likelihood that a frequency detector will incorrectly assert control over a VCO because of metastable-induced errors involves qualifying frequency detector control signals by requiring multiple consecutive control signals that indicate the frequency detector should assert control over the VCO before the frequency detector is allowed to assert control over the VCO. Although it is possible that a metastable-induced error may occasionally trigger an unqualified control signal that indicates the frequency detector should assert control over the VCO, the probability that metastable-induced errors will trigger multiple consecutive control signals that indicate the frequency detector should assert control over the VCO is low enough to meet rigorous performance requirements. In fact, the probability of the frequency detector incorrectly asserting control over the VCO using the qualification technique is a function of the number of consecutive control signals that are required before the frequency detector is allowed to assert control over the VCO.

In an embodiment, the frequency detector control signals are qualified by a series of full-swing library cell flip-flops. An advantage of qualifying the frequency detector control signals is that the undesired effects of metastable-induced errors are reduced to acceptably low levels using fewer CML flip-flops than previous techniques. Instead of using a series of CML flip-flops to ensure that a metastable state resolves itself before reaching the counter, the qualification technique uses only one CML to synchronize the counter enable signal with the VCO signal and then uses a series of full-swing library cell flip-flops to qualify the control signals that are generated upon each frequency measurement cycle. Full-swing library cell flip-flops are preferred over CML flip-flops because 1) the full-swing library cell flip-flops of the qualifier unit are clocked at the sampling interval of the counter instead of at the frequency of the VCO signal, 2) the full-swing library cell flip-flops consume much less power than CML flip-flops, and 3) the full-swing library cell flip-flops require less area on an integrated circuit than CML flip-flops.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 6 depicts an example that illustrates the qualification logic that is implemented by the qualifier unit of FIG. 5.

Throughout the description similar reference numbers are used to identify similar elements.

DETAILED DESCRIPTION

The task of a phase-locked loop (PLL) is to lock the phase and frequency of a voltage controlled oscillator (VCO) signal to a particular signal, referred to herein as an input signal. In accordance with the invention, preventing a frequency detector from incorrectly asserting control over a VCO because of metastable-induced errors involves qualifying frequency detector control signals by requiring multiple consecutive control signals that indicate the frequency detector should assert control over the VCO before the frequency detector is allowed to assert control over the VCO.

Figure 1:
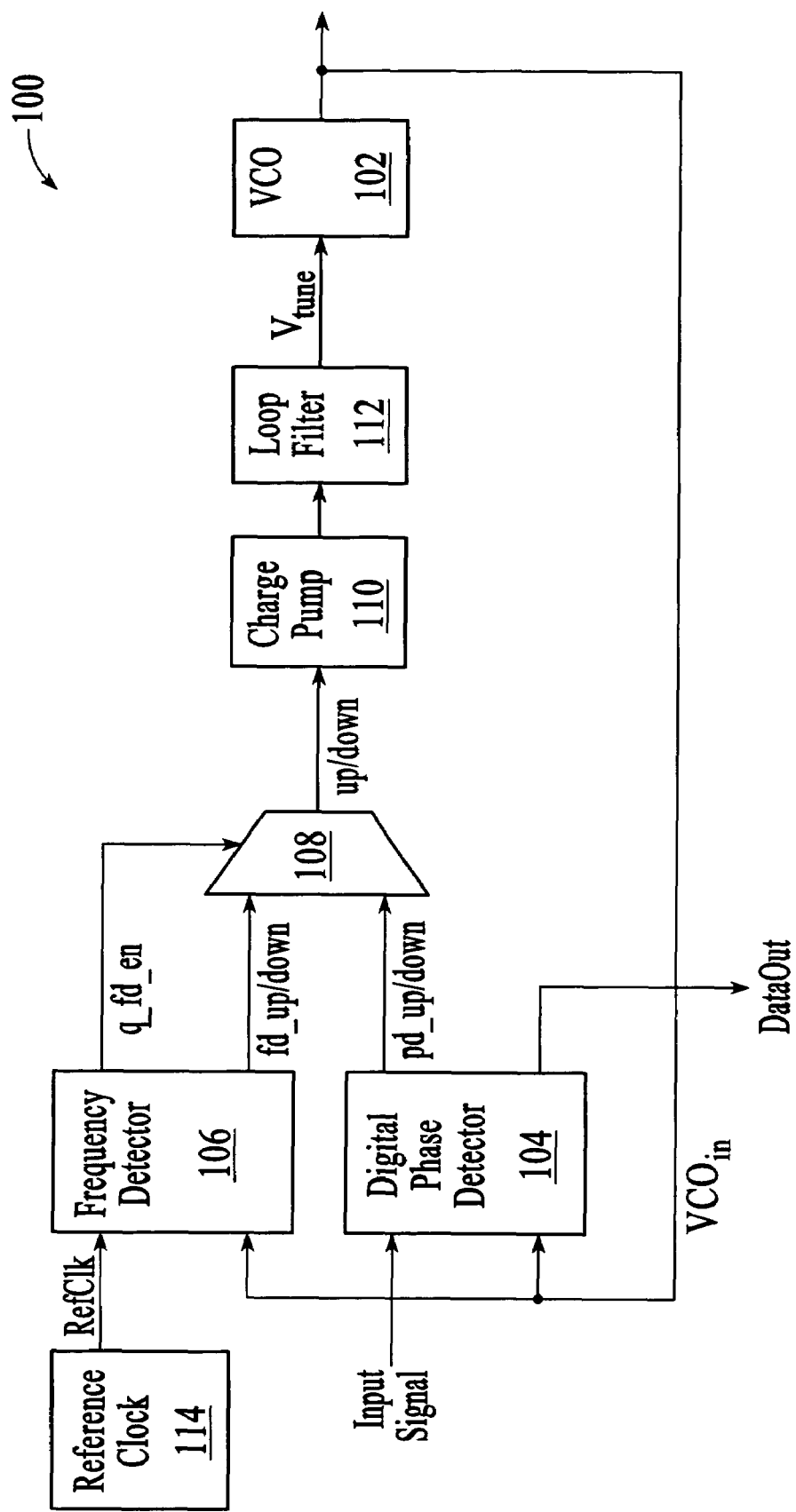
FIG. 1 depicts an embodiment of a PLL that includes a VCO, a digital phase detector, a multiplexer, a charge pump, a loop filter and a frequency detector that is configured to qualify frequency detector control signals in accordance with an embodiment of the invention.

FIG. 1 depicts an embodiment of a PLL 100 that includes a VCO 102, a digital phase detector 104, a multiplexer 108, a charge pump 110, a loop filter 112, and a frequency detector 106 that is configured to qualify frequency detector control signals. The digital phase detector 104 is connected to receive an input signal from a signal source and a portion of the VCO signal ($VCO_{in}$) from the VCO. The input signal carries clock information and data that is to be recovered. As part of the PLL operation, the digital phase detector compares transitions of the input signal with transitions of the VCO signal and generates an output (referred to herein as the "pd_up/down" signal) that indicates the phase difference between the input signal and the VCO signal. The digital phase detector produces an "up" signal when the phase of the input signal leads the phase of the VCO signal and a "down" signal when the phase of the input signal lags the phase of the VCO signal. An up signal is used to drive the frequency of the VCO upward while a down signal is used to drive the frequency of the VCO signal downward, thereby advancing or retarding, respectively, the phase of the VCO signal. The digital phase detector also outputs the recovered data (DataOut). This data is not critical to the invention and is not described further. Although a digital phase detector is described herein, in an alternative embodiment, an analog phase detector can be used in the PLL. The type of phase detector is not critical to the invention.

The frequency detector 106 is connected to receive a portion of the VCO signal ($VCO_{in}$) from the VCO 102 and a reference clock signal (RefClk) from a reference clock source 114 (typically external to the PLL). As is described in more detail below, the frequency detector uses the reference clock signal to measure the frequency of the VCO signal which in turn is used to determine whether or not the frequency detector should assert control over the VCO. The frequency detector asserts control over the VCO when the frequency of the VCO signal is outside a pre-established deadband region that is centered at a setpoint frequency of the VCO. The frequency detector generates a qualified control signal (referred to herein as the "q_fd_en" signal) that indicates whether the VCO is to be controlled by the frequency detector or the digital phase detector 104 (that is, whether control of the VCO by the frequency detector is enabled or disabled). When the frequency detector does not control the VCO because the frequency of the VCO is within the deadband region, the system is said to be in "lock." When the frequency detector does control the VCO because the frequency of the VCO is outside the deadband region, the system is said to be out of lock. The frequency detector also generates an output (referred to herein as the "fd_up/down" signal) that indicates the sign of the frequency difference between the frequency of the VCO signal and the setpoint frequency. In the embodiment of FIG. 1, when the qualified control signal (q_fd_en) is high, the output (fd_up/down) from the frequency detector controls the VCO. Conversely, when the qualified control signal (q_f_en) is low, the output (pd_up/down) from the digital phase detector controls the VCO. The portion of the VCO signal that is received at the frequency detector and the digital phase detector may be divided by N using a signal divider (not shown).

The multiplexer 108 receives the qualified control signal (q_fd_en) from the frequency detector 106 and allows the corresponding control signal (either fd_up/down from the frequency detector or pd_up/down from the digital phase detector 104) to control the charge pump 110 (and ultimately the VCO 102). The charge pump receives an "up/down" signal from the multiplexer and transfers a positive charging current to the loop filter if the up/down signal is "up" or a negative charging current if the up/down signal is "down." The loop filter 112 generates a VCO tuning signal (referred to in the figures as $V_{tune}$) in response to an output from the charge pump. In general, when a positive charging current is received from the charge pump, the tuning voltage output from the loop filter is increased, thereby causing the frequency of the VCO to increase. Conversely, when a negative charging current is received from the charge pump, the tuning voltage output from the loop filter is decreased, thereby causing the frequency of the VCO to decrease.

Operation of the PLL 100 depicted in FIG. 1 involves tuning the VCO 102 in response to continuous feedback from the digital phase detector 104 and the frequency detector 106. Starting at the VCO for description purposes, the VCO receives the VCO tuning signal ($V_{tune}$) from the loop filter 112 and produces a VCO signal as an output. A portion of the VCO signal ($VCO_{in}$) is fed into the digital phase detector and the frequency detector. The digital phase detector and the frequency detector generate output signals pd_up/down, q_fd_en, and fd_up/down) in response to the VCO signal ($VCO_{in}$). The output signal from either the digital phase detector or the frequency detector is selected by the multiplexer 108 in response to the qualified control signal (q_fd_en). The selected output signal is used to adjust the VCO control signal ($V_{tune}$) and as a result the frequency of the VCO.

Figure 2:
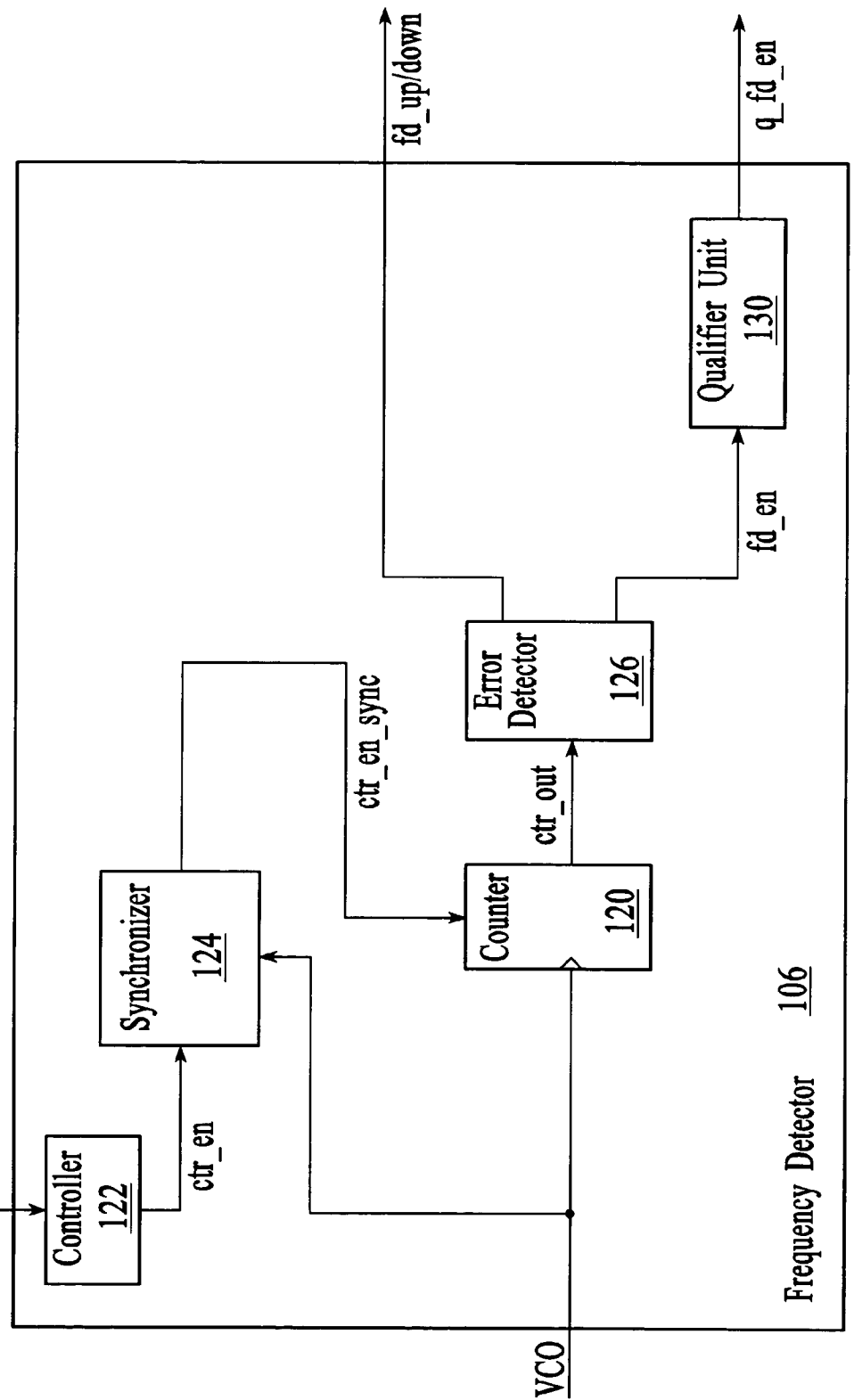
FIG. 2 depicts an expanded view of the frequency detector from FIG. 1 that is configured to prevent the frequency detector from incorrectly asserting control over the VCO because of a metastable-induced error.

As stated above, the invention relates to preventing the frequency detector 106 from incorrectly asserting control over the VCO 102 because of a metastable-induced error. FIG. 2 depicts an embodiment of the frequency detector 106 from FIG. 1 that is configured to prevent the frequency detector from incorrectly asserting control over the VCO because of a metastable-induced error. The frequency detector depicted in FIG. 2 includes a counter 120, a controller 122, a synchronizer 124, an error detector 126, and a qualifier unit 130. The frequency detector receives a VCO signal from the VCO (FIG. 1) and a reference clock signal (RefClk) from the reference clock (FIG. 1). The frequency detector outputs the control signals fd_up/down and q_fd_en.

With reference to FIG. 2, the counter 120 is enabled and disabled in response to a synchronized counter enable signal (ctr_en_sync). The counter counts voltage transitions of the VCO signal and outputs frequency information in the form of a counter output signal (ctr_out) that indicates the number of transitions that were counted during a given sampling interval. The counter output signal (ctr_out) is used to produce the control signals fd_up/down and q_fd_en. In an embodiment, the counter may be preset to a start value at the beginning of each sampling period as described in the above-referenced patent application. As used herein, the terms "counter enable signal" and "synchronized counter enable signal" are understood to include any signal or signals used to enable and disable the counter. In the embodiment of FIG. 2, the counter is a binary digital counter, although other counter types are possible. Additionally, although the counter is incremented in this example, the counter could alternatively be decremented instead of incremented. In another embodiment, the counter is continuously run with counter values being checked at known sampling intervals to obtain frequency information.

Figure 3:
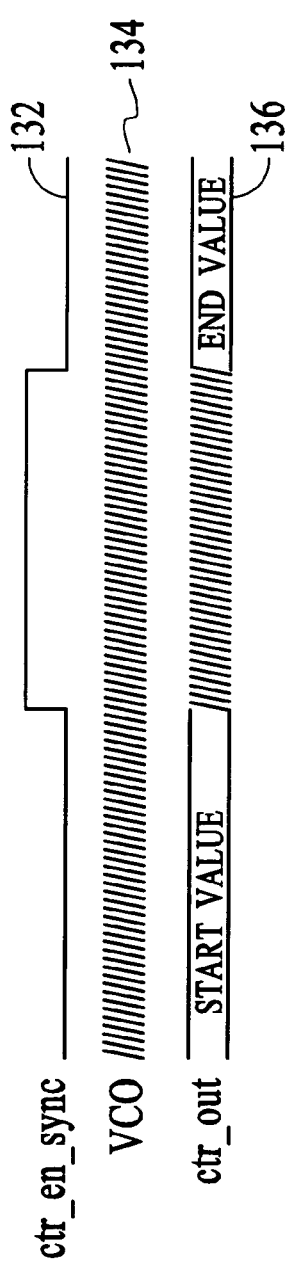
FIG. 3 depicts an example of a sampling interval that is controlled by a synchronized counter enable signal.

The controller 122 is configured to control the timing of frequency measurements. The controller receives the reference clock signal (RefClk) from the reference clock (FIG. 1) and uses the reference clock signal to time known intervals over which the counter 120 is enabled. The controller enables and disables the counter with a counter control signal. In the embodiment of FIG. 2, the controller provides a counter enable signal (ctr_en) to the synchronizer 124, which in turn, provides a synchronized counter enable signal (ctr_en_sync) to the counter. The synchronized counter enable signal ultimately enables and disables the counter. FIG. 3 depicts an example of a sampling interval that is controlled by a synchronized counter enable signal from the controller. The example includes waveforms of the synchronized counter enable signal 132, a VCO signal 134, and a counter output signal 136 (ctr_out) relative to each other. As shown in FIG. 3, the sampling interval starts when the synchronized counter enable signal (ctr_en_sync) goes high and ends when the synchronized counter enable signal goes low. While the counter is enabled, the counter output value is incremented at each VCO signal transition. The end value of the counter represents the number of VCO signal transitions that occurred during the sampling interval, which is easily translated to a measure of frequency in cycles per second. Referring back to FIG. 2, the controller may be embodied in hardware, software, firmware, or any combination thereof.

The synchronizer 124 depicted in FIG. 2 receives the counter enable signal (ctr_en) from the controller 122 and the VCO signal from the VCO 102 and "synchronizes" the two signals to reduce the probability of providing an unresolved counter enable signal to the counter 120. As used herein, synchronizing the counter enable signal and the VCO signal involves time-aligning the transition of the counter enable signal (ctr_en) with a transition of the VCO signal. Time-aligning the transition of the counter enable signal (ctr_en) with a transition of the VCO signal reduces the likelihood that the transition of the synchronized counter enable signal (ctr_en_sync) will collide with a transition of the VCO signal at the counter.

Figure 4:
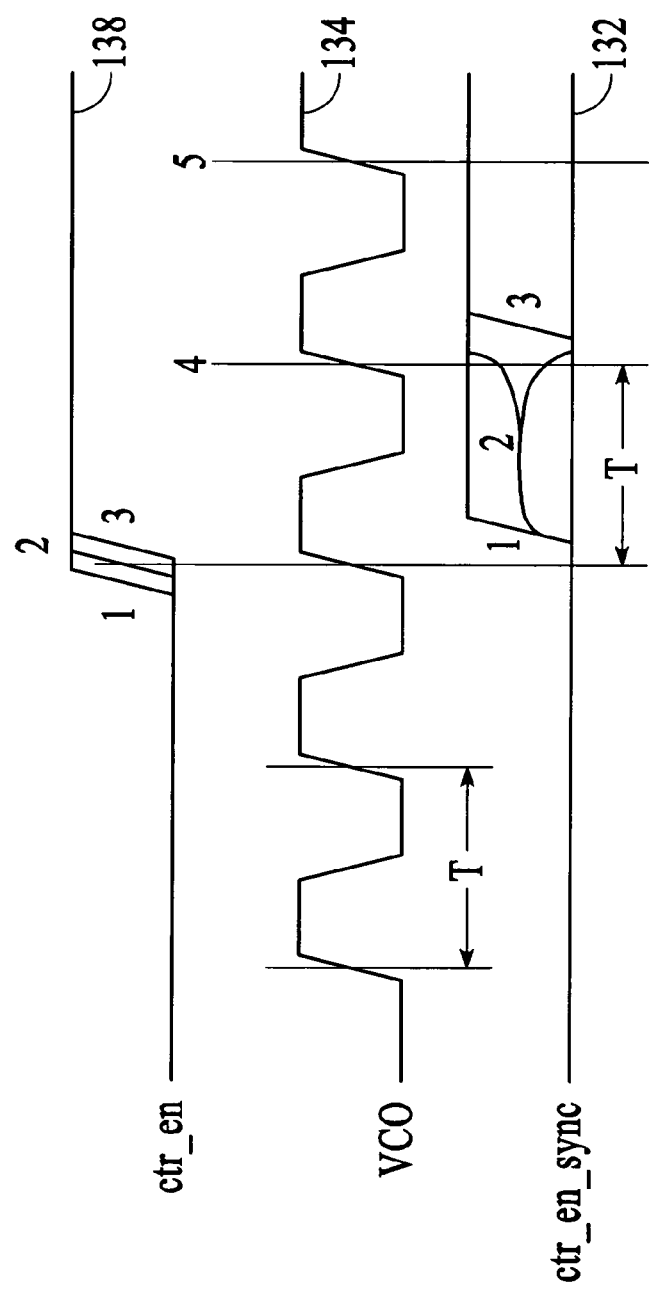
FIG. 4 illustrates the timing of an unresolved counter enable signal.

FIG. 4 illustrates the problem of an unresolved counter enable signal. In particular, FIG. 4 depicts example waveforms of the counter enable signal 138 (ctr_en), the VCO signal 134, and the synchronized counter enable signal 132 (ctr_en_sync) relative to each other. The example includes three possible transitions of the counter enable signal (ctr_en) that occur in the vicinity of a rising edge of the VCO signal. When the transition of the counter enable signal (ctr_en) occurs at position 1, before the flip-flop setup time, the synchronized counter enable signal (ctr_en_sync) goes immediately high after the inherent latch delay (see position 1 of the ctr_en_sync waveform), and the counter begins counting at the next VCO transition (see position 4 of the VCO waveform). When the transition of the counter enable signal (ctr_en) occurs at position 3, after the flip-flop setup time, the synchronized counter enable signal (ctr_en_sync) does not transition until after the next edge of the VCO signal (see position 3 of the ctr_en_sync waveform and position 4 of the VCO waveform, respectively), and therefore, the counter begins counting on the transition at position 5 of the VCO waveform. The outcomes associated with the first two situations both result in a resolved synchronized counter enable signal (ctr_en_sync) being provided to the counter. The problem of an unresolved counter enable signal also applies at the falling edge of the counter enable signal (i.e., when the counter is being disabled).

In contrast, when the counter enable signal (ctr_en) changes at position 2, simultaneous with a transition on the VCO signal (assuming zero setup time for this example), the output of the synchronizer 124 is likely to go into a metastable state (see line 2 of the ctr_en_sync waveform), where a metastable state is defined as a signal condition in which all gates connected to the signal do not interpret the signal to have the same logic value. If this metastable state does not resolve to a high or a low signal by the next transition of the VCO signal (see position 4 of the VCO waveform), an unresolved counter enable signal will be provided to the counter, making the counter susceptible to metastable-induced errors which can lead to unpredictable changes in the counter output.

Because it is possible that the transitions of the counter enable signal 138 (ctr_en) and the VCO signal 134 will collide, causing the synchronizer 124 to go into a metastable state, the synchronizer is designed to provide enough delay that it is likely the metastable state will be resolved at the synchronizer. In an embodiment, a single CML flip-flop that is clocked by the VCO signal is used as the synchronizer. If the metastable state is resolved at the synchronizer, the synchronized counter enable signal (ctr_en_sync) will be adequately defined to enable the counter. If the metastable state is not resolved at the synchronizer, the effects of metastable-induced errors are mitigated by the qualifier unit as is described in more detail below.

Referring back to FIG. 2, the error detector 126 uses the counter output signals (ctr_out) from the counter 120 to determine if the frequency of the VCO signal is within the deadband region. For example, the counter output signals are compared to values that represent the deadband limits. At the end of each sampling interval, the frequency detector 106 outputs an unqualified control signal (fd_en), which indicates whether or not the frequency detector should assert control over the VCO. If the frequency of the VCO signal is within the deadband region, the error detector produces a control signal indicating that the frequency detector should not assert control over the VCO (e.g., fd_en is low). If on the other hand, the frequency of the VCO signal is not within the deadband region, the error detector produces a control signal indicating that the frequency detector should assert control over the VCO (e.g., fd_en is high). The error detector also produces the output fd_up/down (FIG. 1).

The qualifier unit 130 receives the unqualified control signals (fd_en) from the error detector 126, qualifies these unqualified control signals, and produces a qualified control signal (q_fd_en) that indicates whether the frequency detector should assert control over the VCO. In accordance with the invention, qualifying the initial control signals from the error detector involves requiring multiple consecutive control signals that indicate the frequency detector should assert control over the VCO before the frequency detector is allowed to assert control over the VCO. Requiring multiple consecutive signals that indicate the frequency detector should assert control over the VCO before the frequency detector is allowed to assert control over the VCO reduces the likelihood of metastable-induced errors causing control of the VCO to be switched to the frequency detector from the digital phase detector. For example, the qualification unit prevents a single incorrect control signal that results from a metastable-induced error from causing the frequency detector to assert control over the VCO. Although it is possible that a metastable state may occasionally trigger the unqualified control signal (fd_en) to go high (e.g., falsely indicating that the frequency detector should assert control over the VCO), the probability of the control signal being high multiple consecutive times because of metastable-induced errors is low enough to meet rigorous performance standards. The probability of an incorrect qualified control signal (q_fd_en) being issued by the frequency detector is a function of the number of consecutive control signals that are required by the qualifier unit before the frequency detector is allowed to assert control over the VCO. In an embodiment, the qualification unit is implemented with a series of full-swing library cell flip-flops.

Operation of a frequency detector with qualification control is now described with reference to FIG. 2. Referring to the controller 122, a counter enable signal (ctr_en) is generated and output to the synchronizer 124. The synchronizer receives the counter enable signal (ctr_en) and synchronizes the counter enable signal with the VCO signal. The synchronized counter enable signal (ctr_en_sync) is provided to the counter 120 to trigger the counting of VCO signal transitions. After a known sampling interval, the controller changes the counter enable signal (e.g., makes ctr_en go low), which causes the synchronized counter enable signal (ctr_en_sync) to go low and the counter to stop counting VCO signal transitions. The counter output signal (ctr_out), which indicates the number of transitions that occurred during the sampling interval, is provided to the error detector 126. The error detector uses the counter output signal to generate an unqualified control signal (fd_en) that indicates if the frequency detector should assert control over the VCO. The unqualified control signal (fd_en) is provided to the qualifier unit 130 and qualified as described above. The qualifier unit then produces a qualified control signal (q_fd_en) that indicates if the frequency detector should assert control over the VCO.

Figure 5:
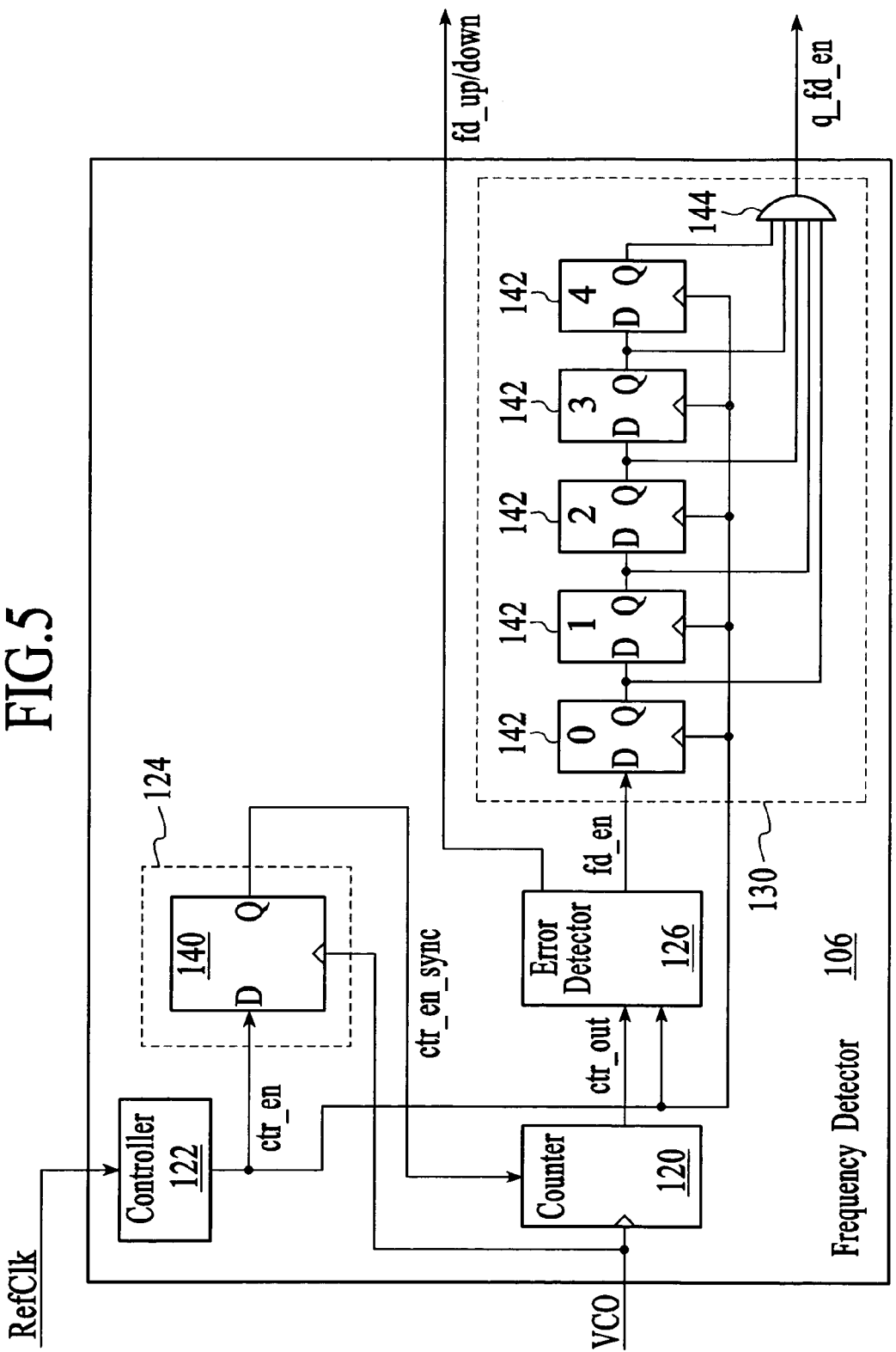
FIG. 5 depicts an embodiment of the frequency detector of FIG. 2 in which the synchronizer is implemented with a CML flip-flop and the qualifier unit is implemented with a series of full-swing library cell flip-flops in accordance with an embodiment of the invention.

FIG. 5 depicts an embodiment of the frequency detector 106 of FIG. 2 in which the synchronizer 124 is implemented with a CML flip-flop 140 and the qualifier unit 130 is implemented with a series of full-swing library cell flip-flops 142. The CML flip-flop that serves as the synchronizer has the counter enable signal (ctr_en) as the data input and the VCO signal (or a multiple thereof) as the clock input. The CML flip-flop outputs the synchronized counter enable signal (ctr_en_sync) to the counter 120. The series of full-swing library cell flip-flops that serve as the qualifier unit essentially form a shift register. With reference to the qualifier unit, the first flop-flop in the series receives the unqualified control signal (fd_en) from the error detector 126 and all of the flip-flops provide an output to an AND gate 144. The qualified control signal (q_fd_en) is the output of the AND gate. All of the flop-flops are clocked by the counter enable signal (ctr_en) so that the unqualified control signals shift through the qualifier unit at each new sample interval. In the configuration of FIG. 5, there are five flip-flops in the qualifier unit and therefore the qualified control signal (q_fd_en) will only indicate that the frequency detector should assert control over the VCO (e.g., q_fd_en goes high) upon receiving five consecutive high unqualified control signals (fd_en). That is, when the PLL is locked (e.g., when the frequency detector is not asserting control over the VCO and q_fd_en is low), the frequency detector will only assert control over the VCO after five consecutive high unqualified control signals are received by the qualifier unit. Although the embodiment of FIG. 5 includes five flip-flops and requires five consecutive high unqualified control signals before the frequency detector asserts control over the VCO, the number of flip-flops, k, and required consecutive high unqualified control signals can be more or less than five. The particular number of consecutive signals required is a function of the performance requirements of the PLL. Each additional flip-flop will further lower the probability that a metastable-induced error will cause the frequency detector to incorrectly assert control over the VCO. Through probability analysis it has been found that a series of five flip-flops in combination with the synchronizer will produce a probability of failure after one year that is on the order of $10^{31}$ when the CML flip-flop of the synchronizer has a time constant on the order of $1/10$ the time that the CML flip-flop 140 is allowed to resolve.

FIG. 6 depicts an example that illustrates the qualification logic that is implemented by the qualification unit of FIG. 5. Specifically, FIG. 6 depicts the outputs of each flip-flop in the series of five flip-flops and the AND'd output of all of the flip-flops. In the example, a "0" (or low signal) indicates that the frequency detector should not assert control over the VCO and a "1" (or high signal) indicates that the frequency detector should assert control over the VCO. Referring to FIG. 6, at sampling interval 1, there are no unqualified control signals indicating that the frequency detector should assert control over the VCO and the qualified control signal (q_fd_en) indicates that the frequency detector should not assert control over the VCO. At sampling interval 2, an unqualified control signal is received that indicates the frequency detector should assert control over the VCO. However, because the qualifier unit requires five consecutive high signals, the qualified control signal (q_fd_en) does not change. At sampling intervals 3–6, the single high control signal progresses through the flip-flops and the qualified control signal does not change. As shown in FIG. 6, a single positive control signal, which may be caused by a metastable state, does not cause the frequency detector to incorrectly assert control over the VCO. At sampling interval 7, another positive control signal is received at the first flip-flop. During sampling intervals 8–11, four more consecutive positive control signals are received at the qualifier unit. Upon receiving the fifth consecutive positive control signal at sampling interval 11, the qualified control signal (q_ctr_en) changes to high and the change in the qualified control signal to high causes the frequency detector to assert control over the VCO.

Although increasing the number of consecutive control signals that are required to trigger a high qualified control signal will decrease the probability of the frequency detector incorrectly asserting control over the VCO, there are performance tradeoffs. In particular, because the frequency detector will not assert control over the VCO until there have been five consecutive unqualified control signals, there is an increased latency time between when the frequency of the VCO signal goes out of the deadband region and when the frequency detector asserts control over the VCO.

Another performance tradeoff involves calibration of the VCO using as technique as is described in U.S. patent application Ser. No. 10/775,960, filed Feb. 10, 2004, and entitled CENTERING A MULTIBAND VOLTAGE CONTROLLED OSCILLATOR. During calibration, the VCO signal will repeatedly move in and out of the deadband region. However, using the configuration of the qualifier unit in FIG. 5, once an unqualified control signal goes low, the qualified control signal (q_fd_en) will immediately go low and cannot go high again until there have been another five consecutive high unqualified control signals occur. This latency can interfere with the calibration process.

Figure 7:
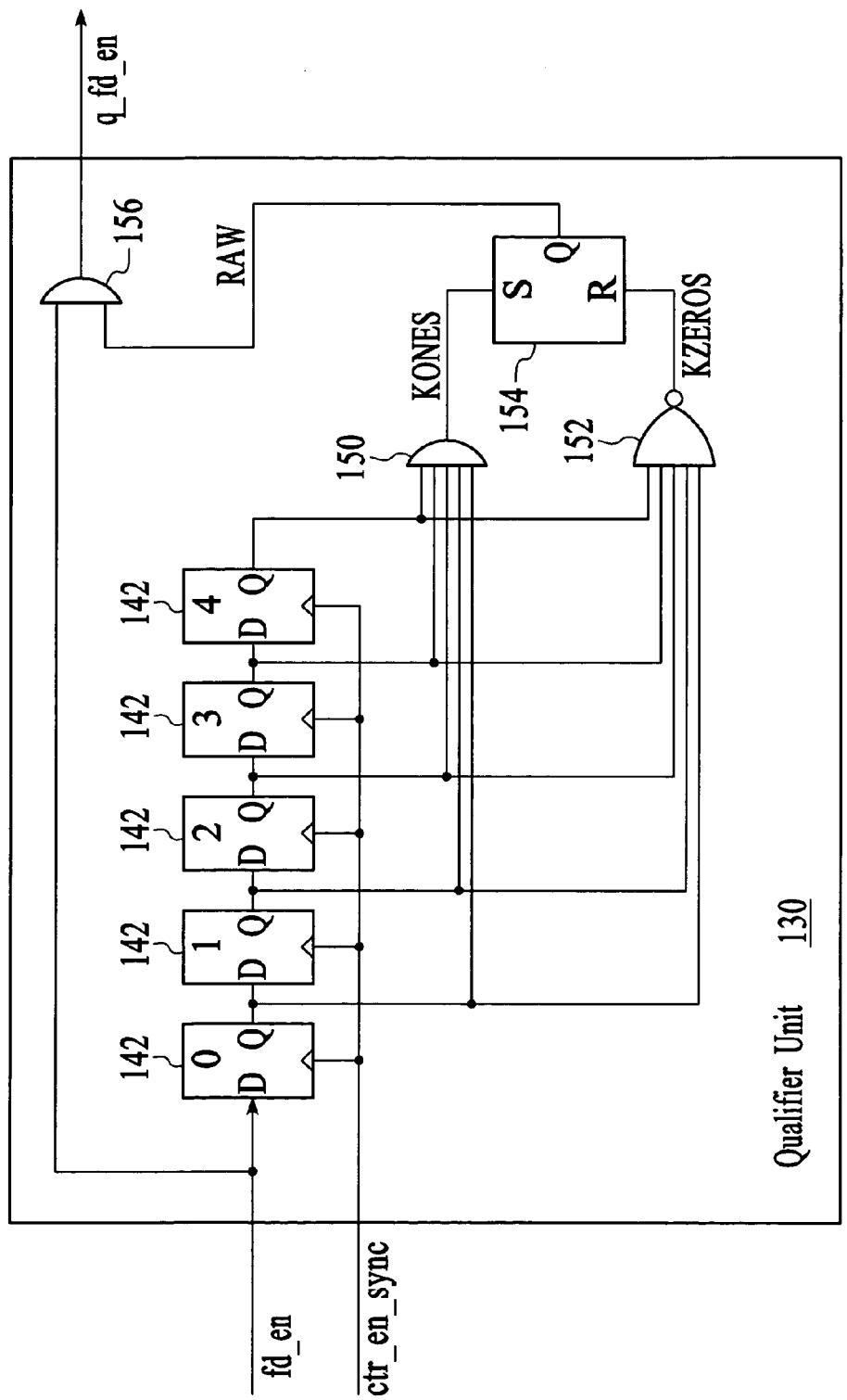
FIG. 7 depicts an example of a qualifier unit that is configured to suspend the qualification process under certain circumstances.

FIG. 7 depicts an example of a qualifier unit 130 that is configured to suspend the qualification process under certain circumstances (e.g., during calibration). As depicted in FIG. 7, the qualifier unit includes an AND gate 150 and a NOR gate 152 connected to the output of each flip-flop 142, an RS flip-flop 154, and an AND gate 156 connected to the unqualified control signal (fd_en) and to the output of the RS flip-flop. In operation, when the PLL 100 has been locked for a while (e.g., fd_en is repeatedly low), the output KONES is zero and the output KZEROS is one. This condition drives the output RAW low such that the qualified control signal (q_fd_en) is held low regardless of the unqualified control signal (fd_en) from the error detector 126. In this instance, the output is being qualified. Occasionally, the unqualified control signal (fd_en) will go high for one frequency measurement cycle due to a metastable-induced error. As described above with reference to FIG. 5, the qualified control signal (q_fd_en) will stay low until there are five consecutive high unqualified control signals. This will probably only happen when the loop has legitimately lost lock and there is a real frequency error. After five consecutive high unqualified control signals (e.g., fd_en goes high for five consecutive frequency measurements), KONES will go high and KZEROS will be low. This condition drives the output RAW high and causes the qualified control signal (q_fd_en) to be the same as the unqualified control signal (fd_en). In this instance, the unqualified control signal is no longer being qualified.

The output of the NOR gate 152, KZEROES, will stay low and the output RAW will stay high until at least five low unqualified control signals are received (e.g., fd_en goes low for five consecutive frequency measurement cycles). During the time that the output RAW stays high, the unqualified control signal (fd_en) will directly determine if the frequency detector asserts control over the VCO and in turn drives the calibration circuitry. For example, using the configuration of FIG. 7, during a calibration cycle, the frequency detector is allowed to chatter on and off with changes in the unqualified control signal as it normally would without the qualifying unit. As long as five consecutive low unqualified control signals are not received, the calibration process proceeds normally. Once the calibration is complete and the frequency error is driven to zero, the unqualified control signal (fd_en) will go low and remain low. After five consecutive low unqualified control signals, KZEROS will go high and KONES will be low driving the output RAW low. Once the output RAW goes low, the unqualified control signal (fd_en) is once again being qualified and the frequency detector cannot assert control over the VCO until there have been five out-of-lock indications in a row.

An advantage of the techniques described with reference to FIGS. 2–7 is that the effects of metastable-induced errors are reduced to acceptably low levels using fewer CML flip-flops than previous techniques. Instead of using a series of CML flip-flops to ensure that a metastable state resolves itself before reaching the counter, the qualification technique described above with reference to FIGS. 5–7 uses only one CML flip-flop 140 to synchronize the counter enable signal with the VCO signal and then uses a series of full-swing library cell flip-flops 142 to qualify the control signals that are generated upon each frequency measurement cycle. Full-swing library cell flip-flops are preferred over CML flip-flops because 1) the full-swing library cell flip-flops of the qualifier unit are clocked at the sampling interval of the counter instead of at the frequency of the VCO signal, 2) the full-swing library cell flip-flops consume much less power than CML flip-flops and the associated clock driving circuitry, and 3) the full-swing library cell flip-flops require less area on an integrated circuit than CML flip-flops.

Figure 8:
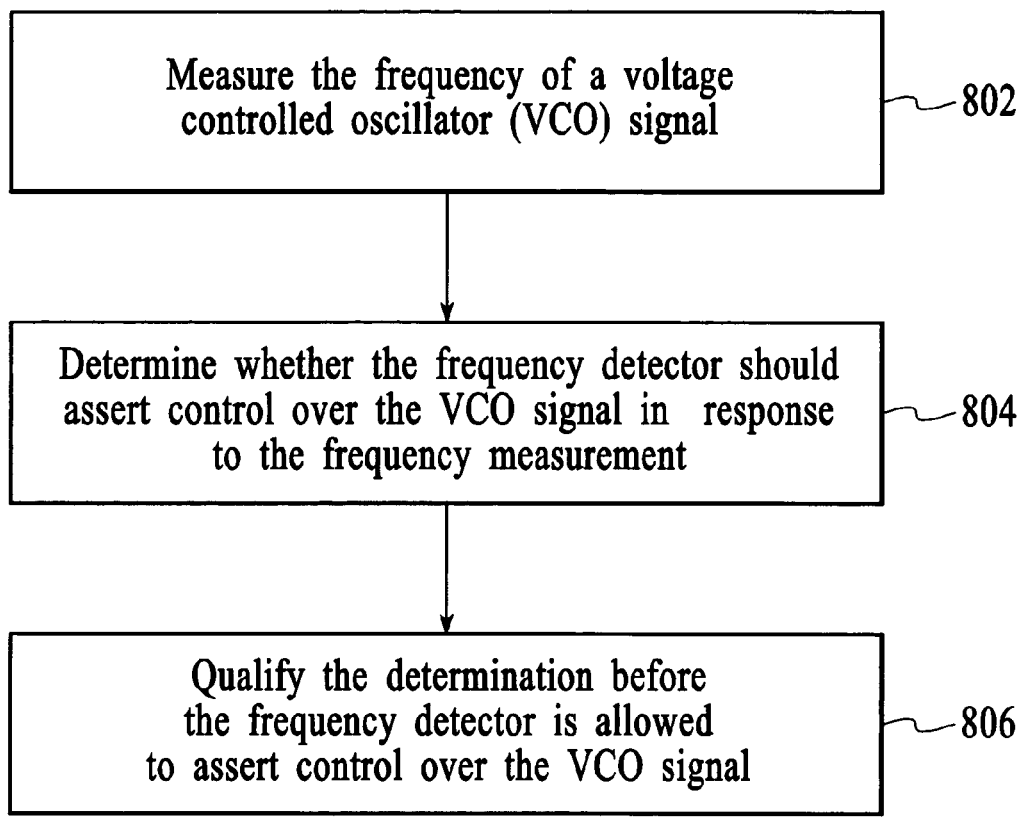
FIG. 8 is a process flow diagram of a method for operating a phase-locked loop in accordance with an embodiment of the invention.

FIG. 8 is a process flow diagram of a method for operating a phase-locked loop in accordance with an embodiment of the invention. At block 802, the frequency of a voltage controlled oscillator (VCO) signal is measured. At block 804, it is determined whether the frequency detector should assert control over the VCO signal in response to the frequency measurement. At block 806, the determination is qualified before the frequency detector is allowed to assert control over the VCO signal.

Although specific embodiments in accordance with the invention have been described and illustrated, the invention is not limited to the specific forms and arrangements of parts so described and illustrated. The invention is limited only by the claims.

What is claimed is:

1. A method for operating a phase-locked loop that includes a frequency detector, the method comprising:
measuring the frequency of a voltage controlled oscillator (VCO) signal;
determining whether the frequency detector should assert control over the VCO signal in response to the frequency measurement;
qualifying the determination before the frequency detector is allowed to assert control over the VCO signal.

2. The method of claim 1 wherein qualifying the determination comprises requiring multiple consecutive frequency measurements that indicate the frequency detector should assert control over the VCO signal before the frequency detector is allowed to assert control over the VCO signal.

3. The method of claim 2 wherein measuring the frequency of the VCO signal comprises enabling a counter for a known sampling interval.

4. The method of claim 3 further including synchronizing an enable signal, which is used to enable the counter, with the VCO signal.

5. The method of claim 2 wherein determining if the frequency detector should assert control over the VCO signal comprises determining if the frequency of the VCO signal falls outside of a deadband region.

6. The method of claim 1 wherein qualifying the determination comprises requiring k consecutive frequency measurements that indicate the frequency detector should assert control over the VCO signal before the frequency detector is allowed to assert control over the VCO signal.

7. The method of claim 6 wherein k is greater than 4.

8. The method of claim 6 wherein k is determined as a function of performance requirements of the phase-locked loop.

9. The method of claim 1 wherein measuring the frequency of the VCO signal comprises counting transitions of the VCO signal over a known sampling period.

10. A frequency detector for use in a phase-locked loop, the frequency detector comprising:
a counter for measuring the frequency of a signal from a voltage controlled oscillator (VCO) over a known sampling interval;
an error detector, in signal communication with the counter, configured to determine if the frequency detector should assert control over the VCO in response to a frequency measurement from the counter; and
a qualifier unit, in signal communication with the error detector, configured to qualify the determination that is made by the error detector before the frequency detector is allowed to assert control over the VCO.

11. The frequency detector of claim 10 wherein the qualifier unit is configured to require multiple consecutive frequency measurements that indicate the frequency detector should assert control over the VCO before the frequency detector is allowed to assert control over the VCO.

12. The frequency detector of claim 11 wherein the qualifier unit comprises a series of full-swing flip-flops.

13. The frequency detector of claim 12 further comprising a synchronizer configured to synchronize an enable signal, which is used to enable the counter over the known sampling interval, with the VCO signal.

14. The frequency detector of claim 13 wherein the synchronizer comprises a common mode logic (CML) flip-flop.

15. The frequency detector of claim 13 wherein the error detector is configured to determine whether the frequency of the VCO signal falls outside of a deadband region.

16. The frequency detector of claim 10 wherein the qualifier unit is configured to require greater than 4 consecutive frequency measurements that indicate the frequency detector should assert control over the VCO before the frequency detector is allowed to assert control over the VCO.

17. The frequency detector of claim 10 wherein the qualifier unit comprises a series of full-swing flip-flops configured to require multiple consecutive frequency measurements, which indicate the frequency detector should assert control over the VCO, before the frequency detector is allowed to assert control over the VCO.

18. A frequency detector for use in a phase-locked loop, the frequency detector comprising:
a controller configured to receive a reference clock signal and to generate a counter enable signal;
a synchronizer configured to receive a voltage controlled oscillator (VCO) signal and the counter enable signal and to generate a synchronized counter enable signal;
a counter operating in response to the synchronized counter enable signal to measure the frequency the VCO signal over a known sampling interval;
an error detector, in signal communication with the counter, configured to determine whether the frequency detector should assert control over the VCO in response to a frequency measurement from the counter; and
a qualifier unit, in signal communication with the error detector, configured to qualify the determination made by the error detector before the frequency detector is allowed to assert control over the VCO.

19. The frequency detector of claim 18 wherein the qualifier unit is configured to require multiple consecutive frequency measurements that indicate the frequency detector should assert control over the VCO before the frequency detector is allowed to assert control over the VCO.

20. The frequency detector of claim 19 wherein the qualifier unit comprises a series of full-swing flip-flops and the synchronizer comprises a common mode logic (CML) flip-flop.

* * * * *